United States Patent

Papazian et al.

[11] Patent Number: 5,990,752
[45] Date of Patent: Nov. 23, 1999

[54] METHOD FOR MECHANICALLY TUNING A VOLTAGE CONTROLLED OSCILLATOR

[75] Inventors: Harold Papazian, Northbrook; Glen O. Reeser, Palatine; Lunal Khuon, Bolingbrook; Edward Bruzgo, Mundelein; Sang Kim, Cicero, all of Ill.

[73] Assignee: CTS Corporation, Elkhart, Ind.

[21] Appl. No.: 09/079,085

[22] Filed: May 14, 1998

[51] Int. Cl.⁶ .................. H03B 5/18; H01P 7/00; H01P 7/08
[52] U.S. Cl. .................. 331/96; 331/44; 331/68; 331/107 DP; 331/117 D; 331/179; 333/235
[58] Field of Search .................. 331/44, 68, 96, 331/108 D, 107 DP, 117 D, 179, 181; 333/235

[56] References Cited

U.S. PATENT DOCUMENTS

| | | | |
|---|---|---|---|
| 5,343,176 | 8/1994 | Hasler | 333/204 |
| 5,499,445 | 3/1996 | Boyle et al. | 29/830 |
| 5,627,550 | 5/1997 | Sinad | 343/700 MS |
| 5,657,028 | 8/1997 | Sinad | 343/700 MS |

*Primary Examiner*—David Mis
*Attorney, Agent, or Firm*—Jones, Day, Reavis & Pogue

[57] ABSTRACT

A method (100) for mechanically tuning a VCO that has a resonant stripline having vias in predetermined locations connected through a circuit board to ground. This includes a step (104) of measuring the operating frequency of the VCO. A following step (106) includes calculating an amount of frequency shift needed to achieve a desired frequency. A following step (108) matches the amount of frequency shift needed to values in a look-up table of frequency shifts versus via locations to determine which vias locations will provide the proper amount of frequency shift. A last step (110) includes mechanically disconnecting from ground the via locations indicated in the third step such that the desired frequency is achieved. This method (100) of tuning allows VCO frequency adjustment after final assembly avoiding problems of frequency shifts that can occur due to the placement of a metal lid on the circuit board after assembly.

11 Claims, 2 Drawing Sheets

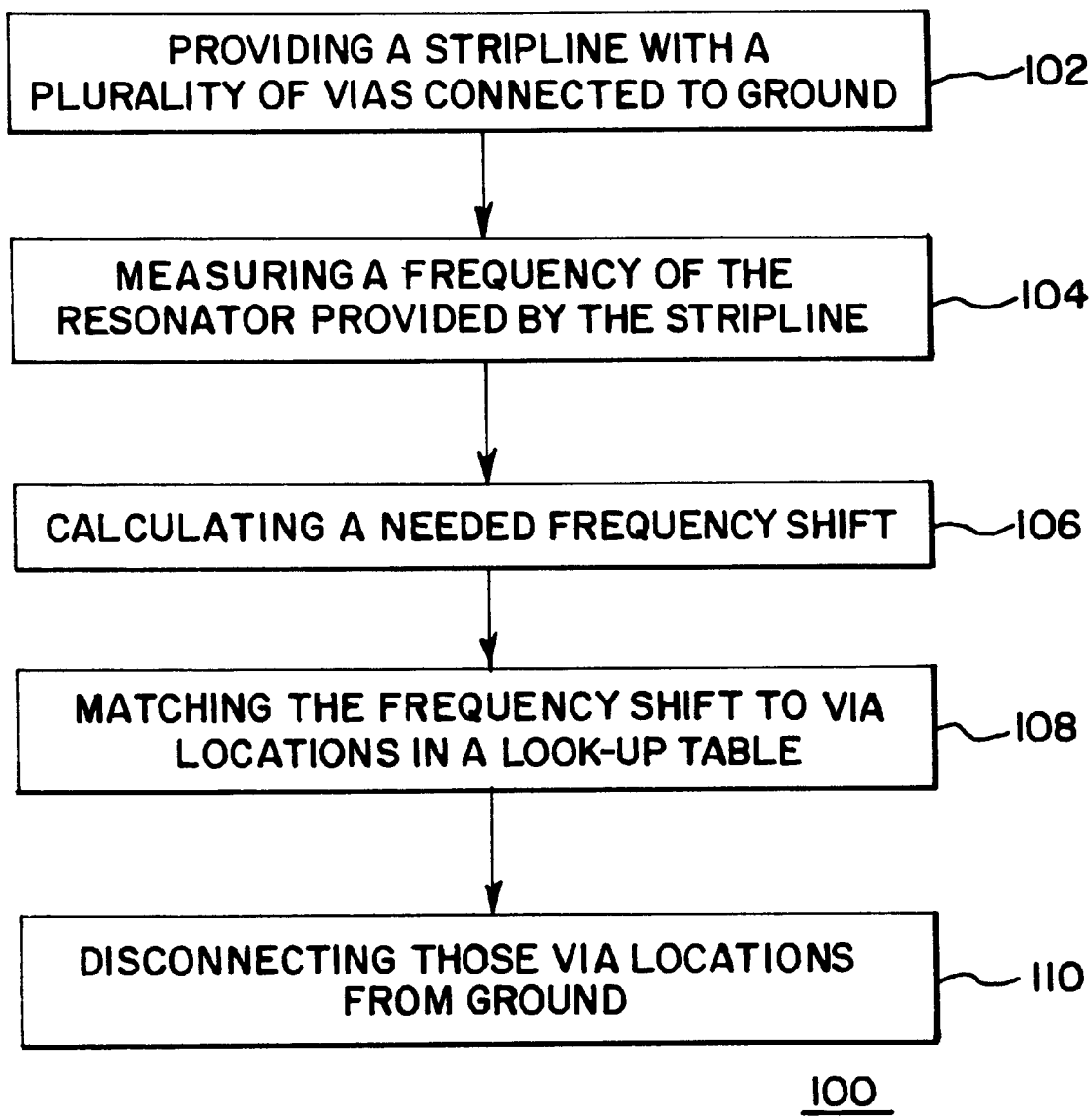

METHOD FOR MECHANICALLY TUNING A VOLTAGE CONTROLLED OSCILLATOR

FIELD OF THE INVENTION

The present invention relates generally to voltage controlled oscillators used in frequency synthesizers in communication devices and, in particular, to adjusting the operating frequency of voltage controlled oscillators.

BACKGROUND OF THE INVENTION

Radio communication devices, such as portable telephones, require a stable operating frequency provided by a local oscillator. Typically, the frequency of a local oscillator is generated by a voltage controlled oscillator (VCO). The operating frequency of voltage controlled oscillators used in these portable telephones is strongly dependent on parts tolerances and manufacturing techniques.

In particular, the etching variations of striplines defined on circuit boards of VCOs can cause large frequency shifts. Some prior art methods to adjust the operating frequency of VCOs have included; deforming coils, using trimmable capacitors and using variable inductors. These methods have the disadvantage of having the potential to change frequency in the field, either through a mechanical shock or through intentional physical adjustment. In addition, these methods are used before the VCO is sealed. Therefore, the frequency of the VCO may change after tuning due to the sealing process itself.

Other more permanent prior art methods to adjust the operating frequency of VCOs have used cutting techniques to remove conductive material from the circuit traces or specially provided large area capacitors designed to be mechanically trimmed. The actual cutting action was provided by laser trimming, sand abrasion, or mechanically by using a Dremel™ tool, for example. However, these methods are used before the VCO is sealed. Therefore, although these methods are more permanent, the frequency of the VCO may change due to the sealing process itself, as stated above.

There is a need for a VCO tuning method that is permanent and can be performed after final assembly of the VCO. There is also a need for a tuning method that does not destroy the integrity of the sealed VCO or introduce contaminants on top of the circuit board. In addition, there is a need for a tuning method that can be applied to a single circuit board being operable for VCOs having widely different frequencies.

BRIEF DESCRIPTION OF THE DRAWINGS

FIG. 4 is a simplified block diagram of a method to tune a VCO, in accordance with the present invention.

DETAILED DESCRIPTION OF THE PREFERRED EMBODIMENT

The present invention provides a VCO tuning method that is permanent and can be performed after final assembly of the VCO. In addition, the present invention provides a tuning method that does not destroy the integrity of the sealed VCO or introduce contaminants on top of the circuit board which could affect frequency. The above characteristics ensure a higher quality product that will not change frequency after tuning or in the field. In addition, the present invention allows the use of a single circuit board configuration that can be used in VCOs operating at a frequencies of from 1.4 to 2.3 GHz.

Figure 1:
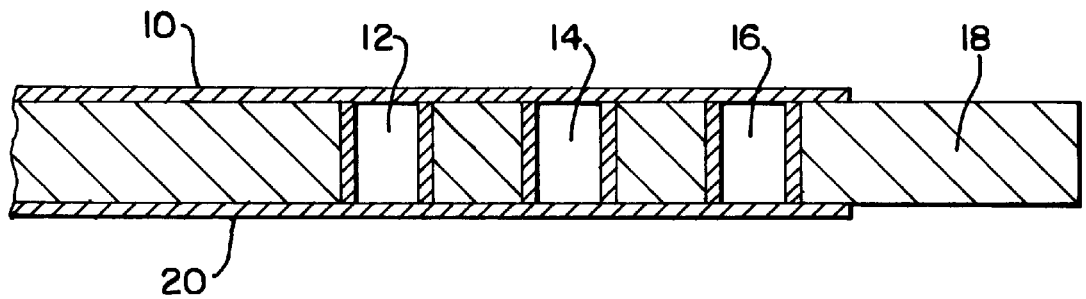
FIG. 1 is a cross-sectional side view of a stripline structure provided with vias, in accordance with the present invention.

FIGS. 1 and 4 show a first step 102 of a method 100 for tuning an effective inductance of a stripline of a resonator on a circuit board so as to change a resonant frequency of the resonator. This first step 102 includes providing a stripline 10 with a plurality of vias 12,14,16 in predetermined locations and being coupled through the circuit board 18 to a source 20 which is preferably a ground. It is not required that the predetermined locations be evenly spaced from each other. Also, the number of vias must be greater than two as it is always necessary to leave at least one connection to the source 20. Three vias 12,14,16 are shown in FIG. 1 only as an example. More vias can be utilized. It is also possible for different vias to be connected to a combination of source and ground. However, it is preferred that the vias be connected to ground, as shown. The vias can be metal-filled vias or blind plated through-holes (as shown) as are known in the art.

Figure 2:
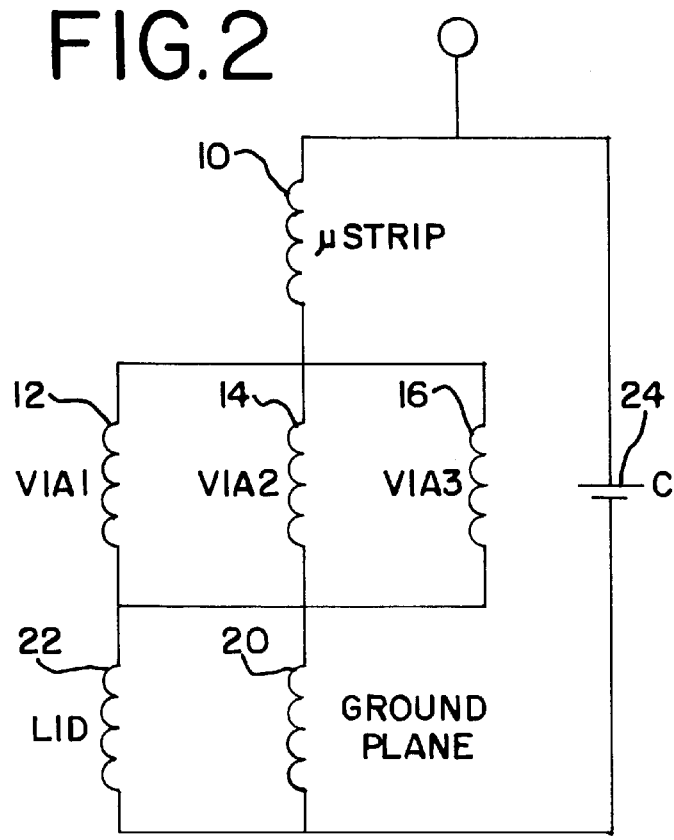
FIG. 2 is a simplified schematic diagram of a VCO resonator using the stripline structure of FIG. 1, in accordance with the present invention.

In a preferred embodiment, the stripline 10 is incorporated within a VCO as part of a resonant circuit. FIG. 2 shows a circuit model of an LC resonator of a VCO incorporating the stripline structure of FIG. 1, which is hereby incorporated by reference. The capacitance, C, of the resonator is preferably provided by a chip capacitor. A metal lid 22 and the source (ground plane) 20 are modeled as inductors in parallel with each other and in series with the vias. The inductance provided by the stripline 10 in the LC resonator is added in series with the parallel combination of the via inductances. Opening any via connection to ground will cause a combined inductance of the remaining vias to increase by effectively lengthening the stripline. This in turn raises the inductance of the LC resonator lowering the resonator frequency. It should be noted that it is necessary that at least one of the vias remain connected to the source (ground).

Referring to FIG. 4, a second step 104 of the method 100 for tuning a stripline in a VCO resonator on a circuit board includes measuring the resonant frequency of the resonator in the LC circuit of the VCO. Measuring frequencies and/or inductances can be performed by many techniques that are well known in the art and will not be presented here.

A third step 106 of the method 100 for tuning a stripline in a VCO resonator includes calculating an amount of frequency shift needed to achieve a desired nominal resonant frequency of the VCO. This is simply done by subtracting the frequency measured in the second step 104 from desired target nominal operating frequency for the VCO. Generally, this will result in a need to shift the frequency downward.

A fourth step 108 of the method 100 for tuning a stripline in a VCO resonator includes matching the amount of frequency shift needed to values in a look-up table of predetermined frequency shifts versus via locations to determine which vias locations, when disconnected, will provide the proper amount of frequency shift needed.

A fifth step 110 of the method 100 for tuning a stripline in a VCO resonator includes disconnecting from ground those via locations indicated in the matching step such that the desired VCO nominal resonant frequency is achieved.

In a preferred embodiment, the disconnecting step includes mechanically disconnecting the vias from ground by cutting through the via from the source (ground plane) upwards toward the stripline. This beneficially allows tuning the VCO from the backside of the circuit board from the ground plane. In addition, this allows tuning the VCO after being fully assembled and prevents contamination on the topside of the circuit board which could adversely affect the resonator frequency.

More preferably, the mechanically disconnecting step includes disconnecting the via from ground through one of the steps of drilling, abrading, and laser trimming, or the like. Although any type of via configurations can be used, it is preferred to provide vias of a standard through-hole via configuration that is not filled. In this way, the through-hole can be used as a pilot hole to align a drill for mechanically disconnecting the via.

In the preferred embodiment, a further sealing step is included wherein the voltage controlled oscillator (from the first (providing) step) is sealed within a package defined by the circuit board and a lid. Alternatively, the entire circuit board could be enclosed within a separate package instead of being part of the package itself. In addition, this embodiment provides for the disconnecting step to occur after the sealing step. In this way, the VCO is tuned after assembly preventing any frequency shifts that could occur during sealing.

This method 100 is readily automatable, in that, equipment can be provided to automated all of the above steps.

The novel method of the present invention provides a permanent frequency adjustment of a VCO and can be performed after final assembly of the VCO. In addition, the tuning method does not destroy the integrity of the sealed VCO or introduce contaminants on top of the circuit board which could affect frequency. In addition, this method allows the use of a single circuit board configuration that can be used for a broad range of frequencies as opposed to supplying different circuit boards for each different VCO frequency.

In operation, the disconnecting of different vias will shift the VCO frequency in a non-additive manner. For example, disconnecting a first or a second via will shift the frequency a first or a second amount, respectively. However, disconnecting both the first and the second via will not result in a frequency shift equal to a sum of the first and second amounts. In general, disconnecting multiple vias will result in a greater frequency shift than can be achieved individually. Therefore, a given number, n, of vias will produce more than n number of frequency shifts. Instead, $2^n-1$ possible operating frequencies are possible: $2^n-2$ frequency shifts in addition to the untuned nominal frequency. The non-additive nature of the present invention is used to advantage by allowing fine and coarse adjustments of the VCO frequency.

EXAMPLE

Referring to FIG. 1, a side view of a microstrip resonant stripline 10 is shown with three vias 12,14,16 connected to ground. Opening the connections of any of the vias or any combination of the vias provides a downward frequency change in the operating frequency of the VCO.

Figure 3:
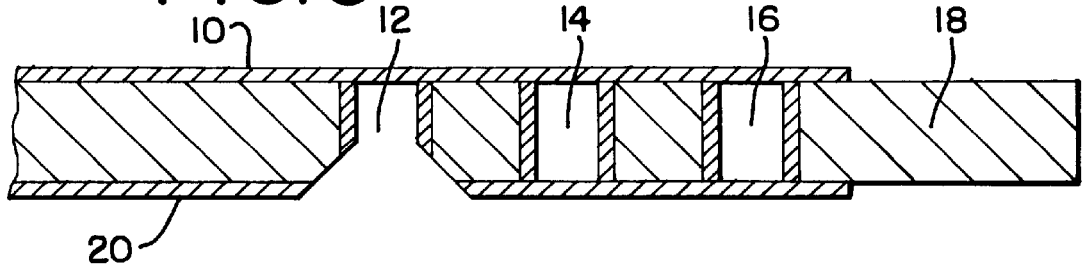
FIG. 3 is a cross-sectional side view of the stripline structure of FIG. 1 where one of the vias has been disconnected from ground, in accordance with the present invention.

For example, an experiment was performed on an 1800 MHz VCO demonstrating the amount of frequency shift that can be obtained. Five tests were done and the actual results are as follows. The first test opened via 12 (as demonstrated in FIG. 3, for example) causing a frequency shift of −80 MHz. The second test opened via 14 causing a frequency shift of −8 MHz. The third test opened via 16 causing a frequency shift of −2 MHz. The fourth test opened vias 12 and 14 causing a frequency shift of −100 MHz. The fifth test opened vias 14 and 16 causing a frequency shift of −15 MHz. It is also possible to open vias 12 and 16 to obtain another different frequency shifts to produce a total a six possible frequency shifts (other than the non-tuned situation where no vias are opened).

As can be seen, opening different vias produces different shifts of varying magnitudes which can be used advantageously to provide six different frequency shifts having coarse or fine frequency adjustment characteristics. In addition, it is possible to control the depth of the drilling of the via to change the amount of discontinuity in the via. It was noticed that increasing drilling depth can reduce the operating frequency slightly more than just opening the connection.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A method for tuning an effective inductance of a stripline of a resonator on a circuit board so as to change a resonant frequency of the resonator, comprising the steps of:

providing the stripline with a plurality of vias in predetermined locations and being coupled through the circuit board to a source;

measuring the resonant frequency of the resonator;

calculating an amount of frequency shift needed to achieve a desired nominal resonant frequency;

matching the amount of frequency shift needed to values in a look-up table of predetermined frequency shifts versus via locations to determine which vias locations will provide the proper amount of frequency shift needed; and disconnecting from the source the via locations indicated in the matching step such that the desired nominal resonant frequency is achieved.

2. The method of claim 1, wherein the providing step includes the source being ground and the disconnecting step includes mechanically disconnecting the vias from ground.

3. The method of claim 2, wherein the mechanically disconnecting step includes disconnecting the via locations from ground through one of the substeps of drilling, abrading, and laser trimming.

4. A method for tuning a voltage controlled oscillator, comprising the steps of:

providing a resonator in the voltage controlled oscillator having a microstrip resonant stripline with a plurality of vias in predetermined locations being coupled through a circuit board to a source;

measuring a resonator frequency of the voltage controlled oscillator;

calculating an amount of frequency shift needed to achieve a desired nominal operating frequency;

matching the amount of frequency shift needed to values in a look-up table of predetermined frequency shifts versus via locations to determine which vias locations will provide the needed amount of frequency shift; and disconnecting from the source the via locations indicated in the matching step such that the desired nominal operating frequency is achieved.

5. The method of claim 4, wherein the providing step includes the source being ground and the disconnecting step includes mechanically disconnecting the vias from ground.

6. The method of claim 5, wherein the mechanically disconnecting step includes disconnecting the via from ground through one of the substeps of drilling, abrading, and laser trimming.

7. The method of claim 4, further comprising a sealing step wherein the voltage controlled oscillator from the providing step is sealed within a package defined by the circuit board and a lid, and wherein the disconnecting step occurs after the sealing step.

8. A method for mechanically tuning a voltage controlled oscillator that has been sealed within a package, comprising the steps of:

provided a resonator in the voltage controlled oscillator having a microstrip resonant stripline with a plurality of vias in predetermined locations being connected through a circuit board to ground;

measuring a resonator frequency of the voltage controlled oscillator;

calculating an amount of frequency shift needed to achieve a desired nominal operating frequency;

matching the amount of frequency shift needed to values in a look-up table of predetermined frequency shifts versus via locations to determine which vias locations will provide the needed amount of frequency shift; and mechanically disconnecting from ground the via locations indicated in the matching step such that the desired nominal operating frequency is achieved.

9. The method of claim 8, wherein the mechanically disconnecting step includes disconnecting the via from ground through one of the substeps of drilling, abrading, and laser trimming.

10. The method of claim 8, further comprising a sealing step wherein the voltage controlled oscillator from the providing step is sealed within a package defined by the circuit board and a lid, and wherein the mechanically disconnecting step occurs after the sealing step.

11. The method of claim 8, wherein all of the steps are automated.

* * * * *